US012588171B2

(12) United States Patent
Takagi et al.

(10) Patent No.: US 12,588,171 B2
(45) Date of Patent: Mar. 24, 2026

(54) HEAT EXCHANGE DEVICE AND POWER CONVERSION DEVICE

(71) Applicant: HITACHI ASTEMO, LTD., Hitachinaka (JP)

(72) Inventors: Yusuke Takagi, Hitachinaka (JP); Yujiro Kaneko, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 368 days.

(21) Appl. No.: 18/260,352

(22) PCT Filed: Sep. 29, 2021

(86) PCT No.: PCT/JP2021/036017
§ 371 (c)(1),
(2) Date: Jul. 5, 2023

(87) PCT Pub. No.: WO2022/153618
PCT Pub. Date: Jul. 21, 2022

(65) Prior Publication Data
US 2024/0057302 A1 Feb. 15, 2024

(30) Foreign Application Priority Data
Jan. 12, 2021 (JP) ................................. 2021-002943

(51) Int. Cl.
*H05K 7/20* (2006.01)
*H01L 23/367* (2006.01)
(Continued)

(52) U.S. Cl.
CPC ......... *H05K 7/20927* (2013.01); *H01L 23/46* (2013.01); *H01L 23/473* (2013.01); *H01L 23/3675* (2013.01)

(58) Field of Classification Search
CPC ... H01L 23/3675; H01L 23/36; H01L 23/473; H05K 7/20927
See application file for complete search history.

(56) References Cited

U.S. PATENT DOCUMENTS

2018/0332739 A1  11/2018  Takeuchi
2021/0057307 A1   2/2021  Ushijima

FOREIGN PATENT DOCUMENTS

JP        S64-71156 A     3/1989
JP        2012-044828 A   3/2012
                  (Continued)

OTHER PUBLICATIONS

International Search Report with English Translation and Written Opinion of International Patent Application No. PCT/JP2021/036017 dated Dec. 21, 2021 (10 pages).

*Primary Examiner* — David A Zarneke
(74) *Attorney, Agent, or Firm* — Foley & Lardner LLP

(57) ABSTRACT
A heat exchange device that is formed in a substantially rectangular shape and that cools a power semiconductor element, and a power conversion device comprising the heat exchange device, the heat exchange device including: a fin formation region in which cooling water flows in a transverse direction; and a buffer region formed in a lamination direction and facing the fin formation region, a partition wall being interposed therebetween, wherein an inlet and an outlet for the cooling water are respectively formed at at least one of both ends in a longitudinal direction, a flow path pit connecting the fin formation region and the buffer region is formed at both ends in the transverse direction, and the buffer region has a partition that divides the cooling water flowing in from the inlet and the cooling water flowing toward the outlet, and the inlet and the outlet are respectively connected to the fin formation region via the flow path pit.

14 Claims, 16 Drawing Sheets

(51) Int. Cl.
    *H01L 23/46*         (2006.01)
    *H01L 23/473*      (2006.01)

(56)           References Cited

FOREIGN PATENT DOCUMENTS

| JP | 2012-129280 | A | 7/2012 |
| JP | 2018-190901 | A | 11/2018 |
| WO | WO-2019/211889 | A1 | 11/2019 |

(INLET SIDE)                    (OUTLET SIDE)

(a)

(INLET SIDE)            (OUTLET SIDE)

(b)

(a)

(b)

(c)

HEAT EXCHANGE DEVICE AND POWER CONVERSION DEVICE

TECHNICAL FIELD

The present invention relates to a heat exchange device and a power conversion device.

BACKGROUND ART

In recent years, in order to cool a molded body including a semiconductor element in a heat exchange device included in a power conversion device, arrangement structures for cooling water channels have been studied day after day. In the prior art, the configuration is such that the water-channel inlet and outlet ports are arranged at both ends in the longitudinal direction, and thus the cooling water flows parallel to the longitudinal direction.

In the structure disclosed in Patent Literature 1, a cooling pipe 3 includes, as a refrigerant flow path 30, a heat exchange unit 37, and a refrigerant supply path 36 and a refrigerant discharge path 38 respectively arranged on both sides in a height direction Z with respect to the heat exchange unit 37, and the heat exchange unit 37 is configured such that a refrigerant w flows in a height direction Z from the refrigerant supply path 36 toward the refrigerant discharge path 38 (FIG. 6). Thus, a structure is disclosed in which cooling water flows inside from the same plane on which fins are arranged.

CITATION LIST

Patent Literature

PTL 1: JP 2018-190901 A

SUMMARY OF INVENTION

Technical Problem

In the method disclosed in Patent Literature 1, there is a concern that the pressure loss of the device increases when the cooling water flowing in from the inlet flows into the fins at a right angle. Therefore, an object of the present invention is to provide a heat exchange device and a power conversion device that reduce pressure loss and improve heat dissipation performance.

Solution to Problem

A heat exchange device that is formed in a substantially rectangular shape and that cools a power semiconductor element, and a power conversion device comprising the heat exchange device, the heat exchange device including: a fin formation region in which cooling water flows in a transverse direction of the heat exchange device; and a buffer region formed in a lamination direction and facing the fin formation region, a partition wall being interposed therebetween, wherein an inlet and an outlet for the cooling water are respectively formed at at least one of both ends in a longitudinal direction of the heat exchange device, a flow path pit connecting the fin formation region and the buffer region is formed in the longitudinal direction at both ends in the transverse direction, and the buffer region has a partition that divides the cooling water flowing in from the inlet and the cooling water flowing toward the outlet, and the inlet and the outlet are respectively connected to the fin formation region via the flow path pit.

Advantageous Effects of Invention

According to the present invention, it is possible to provide a heat exchange device that reduces pressure loss and improves heat dissipation performance, and a power conversion device that includes the heat exchange device.

BRIEF DESCRIPTION OF DRAWINGS

FIG. 4 is an external view of a power module according to a first embodiment of the present invention.

FIG. 6 is an exploded view of a first water channel in FIG. 5.

DESCRIPTION OF EMBODIMENTS

First Embodiment

Figure 1:
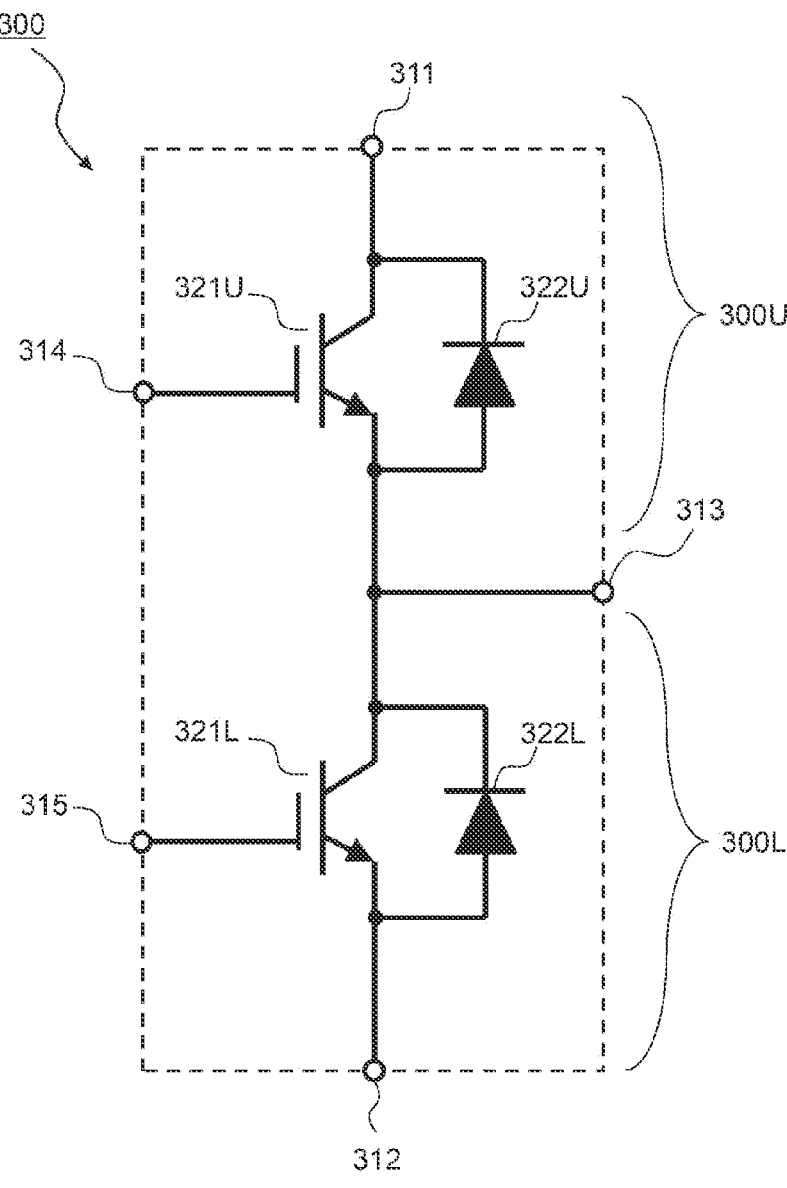
FIG. 1 is a circuit diagram of a molded body.

Hereinafter, embodiments of the present invention will be described with reference to the drawings. However, the present invention is not limited to or by the following embodiments, and the technical concepts of the present invention may be realized by combining other known constituent elements. Note that, in the drawings, the same elements are denoted by the same reference signs, and redundant descriptions are omitted.

FIG. 1 is a circuit diagram of a molded body.

A molded body 300 includes power semiconductor elements 321U, 321L, 322U, and 322L. The power semiconductor elements 321U and 321L are IGBTs of an upper arm and a lower arm, respectively. Further, the power semiconductor elements 322U and 322L are diodes of the upper arm and the lower arm, respectively. Note that the power semiconductor elements 321U, 321L, 322U, and 322L can be applied not only to IGBTs but also to field effect transistors (FETs) and the like.

The molded body 300 includes an upper arm 300U and a lower arm 300L. The upper arm 300U includes an IGBT 321U and a diode 322U, and has a DC positive terminal 311 and a signal terminal 314. The lower arm 300L includes an IGBT 321L and a diode 322L, and has a DC negative terminal 312 and a signal terminal 315. The upper arm 300U and the lower arm 300L have an AC terminal 313 at an intermediate connection point.

The DC positive terminal 311 and the DC negative terminal 312 are connected to a capacitor (not shown) or the like to supply DC power from the outside of the molded body 300 to the power semiconductor elements 321U, 321L, 322U, and 322L. The signal terminals 314 and 315 are connected to a control board, and control switching operations of the power semiconductor elements 321U, 321L, 322U, and 322L. The AC terminal 313 electrically connects the upper arm 300U and the lower arm 300L, and outputs AC power to the outside of the molded body 300.

Figure 2:
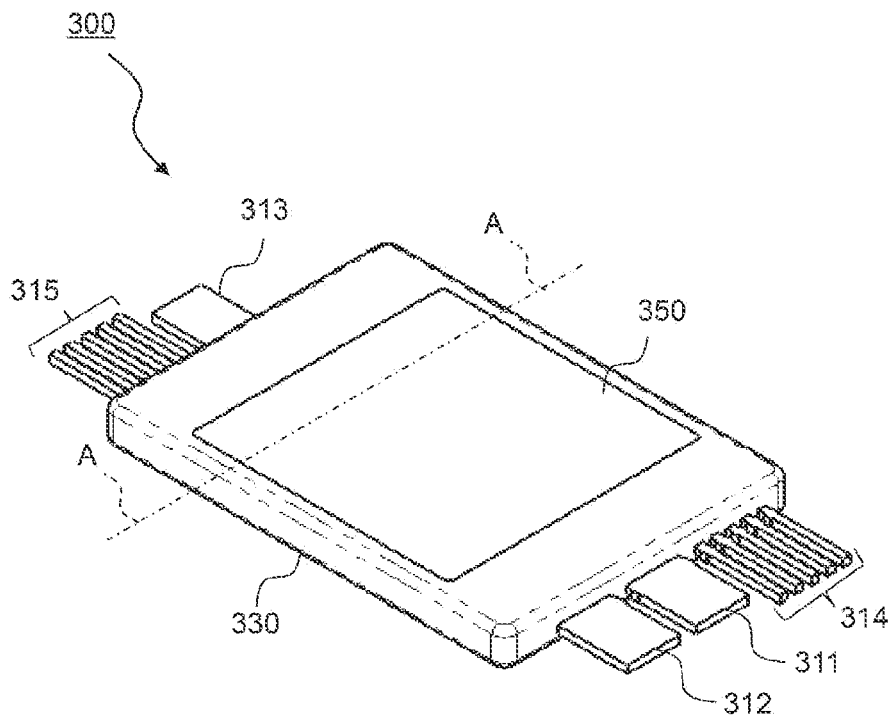
FIG. 2 is an external view of the molded body.

FIG. 2 is an external view of the molded body. Note that the section line A-A is used in FIG. 3.

The molded body 300 is partially sealed using a sealing resin 330. The DC positive terminal 311, the DC negative terminal 312, the AC terminal 313, and the signal terminals 314 and 315, which are connected to the molded body 300, are exposed from the sealing resin 330. The molded body 300 has a heat conduction member 350 exposed from the sealing resin 330.

Figure 3:
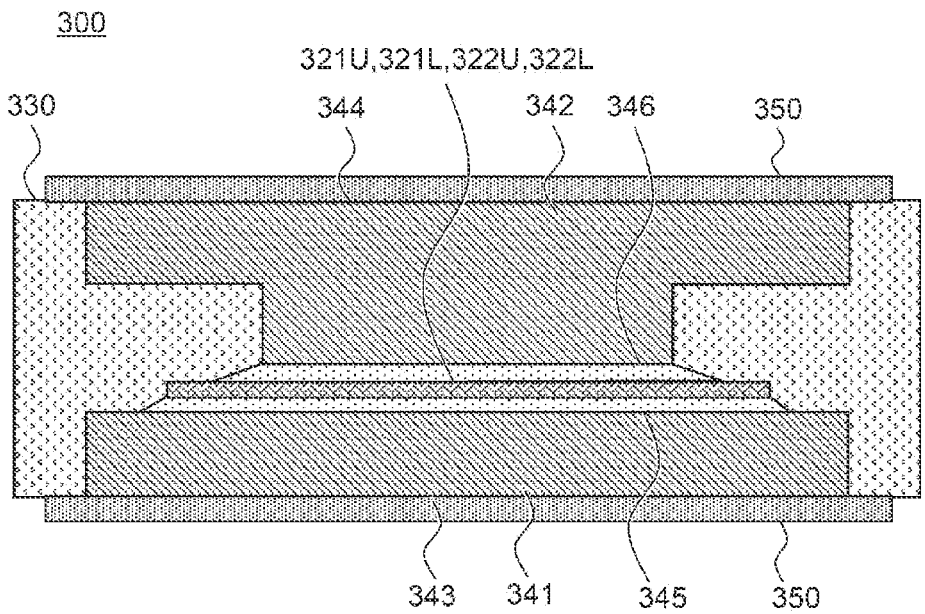
FIG. 3 is a cross-sectional view taken along line A-A in FIG. 2.

FIG. 3 is a cross-sectional view taken along line A-A of the molded body in FIG. 2.

In FIG. 3, a lower surface of each of the power semiconductor elements 321U, 321L, 322U, and 322L is bonded to a first heat sink 341 via a first bonding material 345, and an upper surface of each of said elements is bonded to a second heat sink 342 via a second bonding material 346. The first bonding material 345 and the second bonding material 346 are solder or a sintered material.

The first heat sink 341 and the second heat sink 342 are formed of a metal such as copper or aluminum or of an insulating substrate having copper wiring. The sealing resin 330 seals the power semiconductor elements 321U, 321L, 322U, and 322L, the first heat sink 341, the second heat sink 342, the first bonding material 345, and the second bonding material 346.

The first heat sink 341 has a first heat dissipation surface 343. The first heat dissipation surface 343 is exposed from the sealing resin 330, and is located on a surface of the first heat dissipation plate 341 opposite to a surface bonded to the first bonding material 345.

The second heat sink 342 has a second heat dissipation surface 344. The second heat dissipation surface 344 is exposed from the sealing resin 330, and is located on a surface of the second heat sink 342 opposite to a surface bonded to the second bonding material 346.

The heat conduction member 350 is made of resin or ceramic having insulating performance, and is in close contact with the first heat dissipation surface 343 and the second heat dissipation surface 344, respectively. In a case where the heat conduction member 350 is made of ceramic, the heat conduction member is in close contact with the molded body 300 and with a first water channel 110 and a second water channel 210, which will be described below, via grease or the like. Note that, in a case where an insulating substrate or a resin insulating member is provided inside the molded body 300, the heat conduction member 350 is grease.

Figure 4:
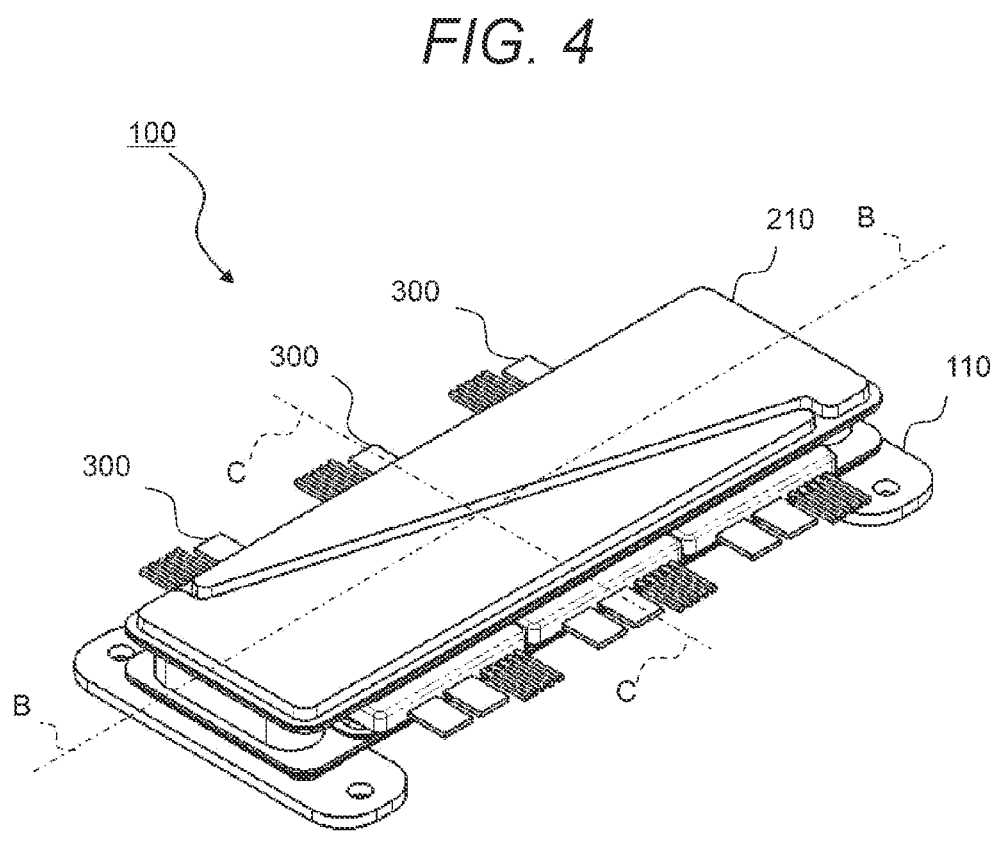

FIG. 4 is an external view of the power module according to a first embodiment of the present invention. Note that the section line B-B is used in FIG. 8, and the section line C-C is used in FIG. 9.

A power module 100 includes the first water channel 110, the second water channel 210, and the molded body 300. Note that, although a plurality of the molded body 300 are sandwiched between the first water channel 110 and the second water channel 210, one molded body 300 may be provided for one set of the first water channel 110 and the second water channel 210.

The first water channel 110 and the second water channel 210 are heat exchange devices that are formed in a substantially rectangular shape and that cool the entire power module 100. That is, in order to release heat to the outside, the molded body 300, which is a heat-generating body, dissipates the heat to the refrigerant flowing inside the first water channel 110 and the second water channel 210 through the heat conduction member 350 described above, whereby the entire molded body 300 and the entire power module 100 are cooled.

Figure 5:
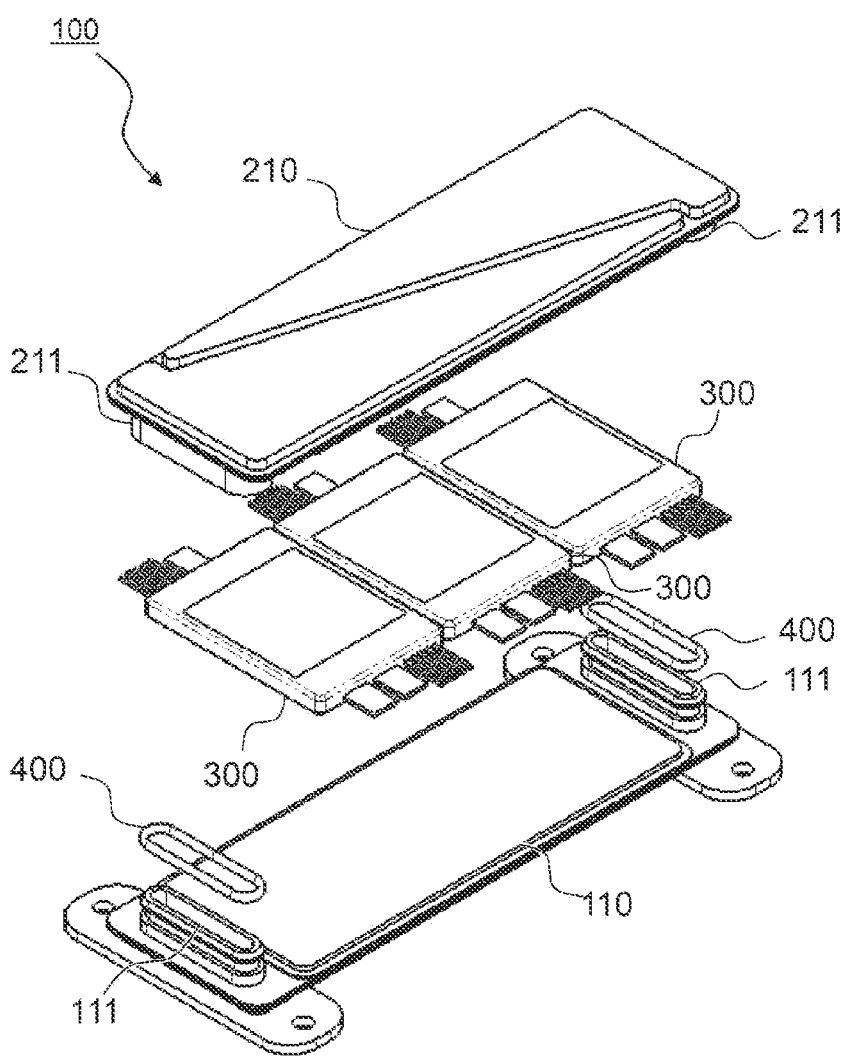
FIG. 5 is an exploded view of FIG. 4.

FIG. 5 is an exploded view of FIG. 4.

The molded body 300 is disposed so as to be sandwiched between the first water channel 110 and the second water channel 210. The substantially rectangular first water channel 110 has a first water channel connector 111 at both ends in the longitudinal direction. The substantially rectangular second water channel 210 has a second water channel connector 211 at both ends in the longitudinal direction. The mutually connecting parts of the first water channel connector 111 and the second water channel connector 211 are sealed by a sealing material 400, thereby forming a water channel for cooling the molded body 300. The sealing material 400 is a member such as a rubber O-ring.

Note that, in the connections to the first water channel connector 111 and the second water channel connector 211, only a single connector (pit) is provided to the respective points of connection at both ends of the substantially rectangular molded body 300, but the structure may also be such that a plurality of connectors (pits) may be provided to establish a flow path connection between the first water channel 110 and the second water channel 210.

Figure 6:
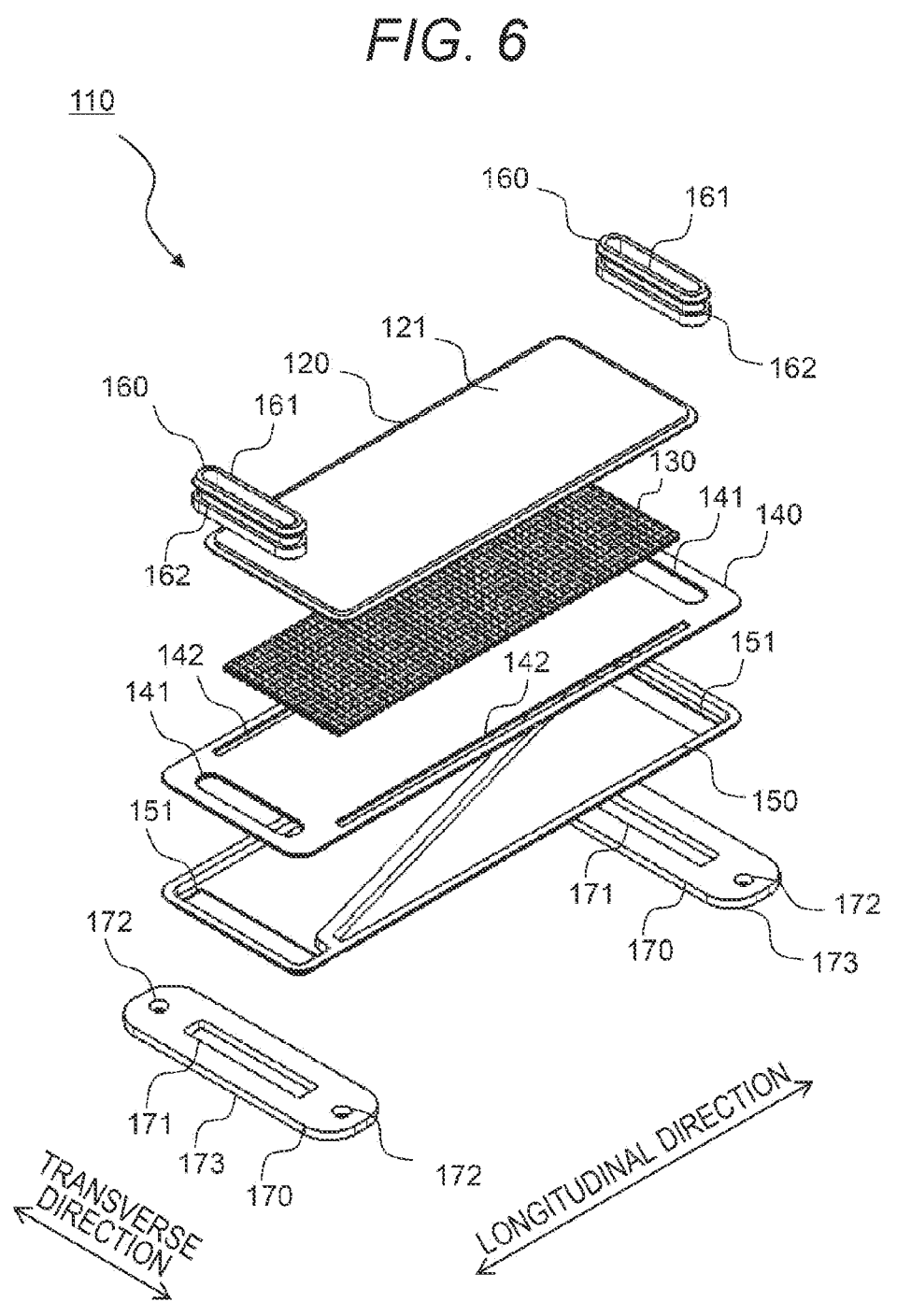

FIG. 6 is an exploded view of the first water channel in FIG. 5.

The first water channel 110 includes a first fin cover 120, a first fin 130, a first intermediate plate 140, a first water channel cover 150, a first pipe 160, and a water channel connection flange 170.

The water channel connection flange 170 has a water channel opening 171, a water channel attachment pit 172, and a water channel attachment surface 173, and is used for a water channel connection to the second water channel 210 at both ends (transverse), in the longitudinal direction, of the first water channel 110 having a substantially rectangular shape. The water channel opening 171 is an inlet or an outlet for cooling water in the first water channel 110. The first water channel 110 is connected by the water channel attachment surface 173 to a case or the like that supplies cooling water from the outside.

The water channel attachment pit 172 is a screw pit for fixation to a case or the like which takes in cooling water from the outside. Note that, in a case where the first water channel 110 is fixed to a case or the like other than by screw fastening, the water channel attachment pit 172 need not be provided.

The first water channel cover 150, which has a substantially rectangular shape, has a first water channel cover opening 151 at both ends (transverse) in the longitudinal direction. The first water channel cover openings 151 are each connected to the water channel opening 171 to form a flow path, and the cooling water flows in the flow path.

The first intermediate plate 140, which has a substantially rectangular shape, has two first intermediate plate first openings 141 at both ends (transverse) in the longitudinal direction. The first intermediate plate first openings 141 each form a water channel connection to the first water channel cover openings 151 to form a water channel.

In addition, the first intermediate plate 140 has two first intermediate plate second openings 142 at both ends (longitudinal) in the transverse direction. Here, a two-layer water channel structure inside the first water channel 110 will be described. The interior of the first water channel 110 includes two layers, which are a buffer region formed by the first water channel cover 150 and the first intermediate plate 140, and a fin formation region formed by the first fin cover 120, the first intermediate plate 140, and the first fin 130.

The first intermediate plate second opening 142 serves as a flow path pit that connects the regions (flow paths) of the two layers. Specifically, first, the cooling water flowing into the buffer region flows into the fin formation region through either one of the first intermediate plate second openings 142. The cooling water, which has passed through the first fin 130 provided in the fin formation region, passes through the other of the first intermediate plate second openings 142 and flows into the buffer region again. Due to such a structure, the first intermediate plate 140 serves as a partition wall formed between the fin formation region and the buffer region that overlap one another in a lamination direction.

The first pipe 160 has a first pipe opening 161 and is connected to the first intermediate plate first opening 141. A sealing material accommodation portion 162 accommodates the sealing material 400 described above and is disposed on the lateral surface of the first pipe 160. Note that the sealing material accommodation portion 162 may be disposed on the top surface of the first pipe 160.

The first fin cover 120 has a first fin cover heat dissipation surface 121. The first fin cover heat dissipation surface 121 cools the molded body 300 described above by means of the cooling water flowing into the first water channel 110 in close contact with the molded body 300. In the first fin cover, the first fin 130 is joined to the first fin cover 120 on a surface opposite to the first fin cover heat dissipation surface 121. The first fin 130 cools the molded body 300 via the first fin cover.

The first fin 130 is joined to the first intermediate plate 140. The first intermediate plate 140 is joined to the first water channel cover 150. The first water channel cover 150 is joined to the water channel connection flange 170. These connections are made by brazing or laser welding.

Note that the water channel opening 171 may be configured as a cooling-water inlet and outlet by using only one first intermediate plate first opening 141 in the first intermediate plate 140 and forming two water channel openings 171 by using only one water channel connection flange 170. Here, the configuration may involve only one of each of the first water channel cover opening 151 and the first intermediate plate first opening 141. In addition, the first fin 130 may be formed on the first fin cover 120 through forging or machining so as to be integrated with the first fin cover 120.

Figure 7:
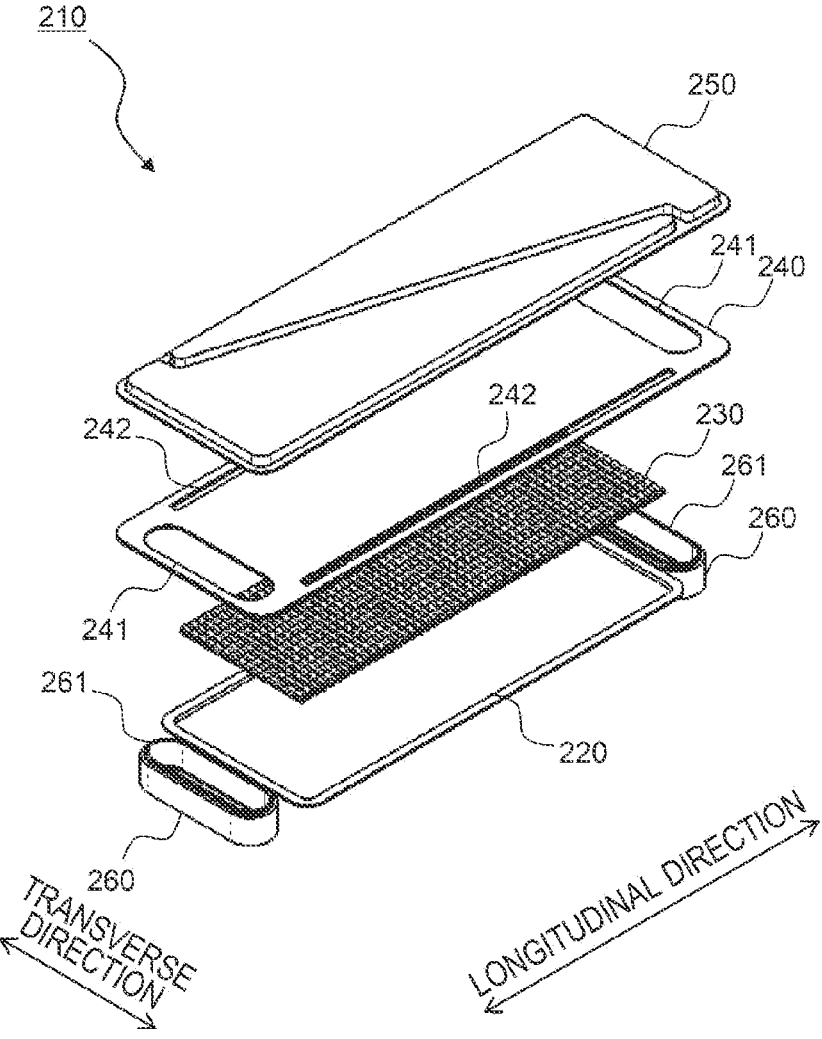
FIG. 7 is an exploded view of a second water channel in FIG. 5.

FIG. 7 is an exploded view of the second water channel. Note that the second water channel has a structure substantially equal to the structure of the first water channel described with reference to FIG. 6, and therefore some descriptions of common parts are omitted.

The second water channel 210 includes a second fin cover 220, a second fin 230, a second intermediate plate 240, a second water channel cover 250, and a second pipe 260.

The second intermediate plate 240, which has a substantially rectangular shape, has two second intermediate plate first openings 241 at both ends (transverse) in the longitudinal direction. The second intermediate plate first opening 241 is connected to a second pipe opening 261 in the second pipe 260 to form a water channel.

In addition, the second intermediate plate 240 has two second intermediate plate second openings 242 at both ends (longitudinal) in the transverse direction. Here, similarly to the interior of the first water channel 110, the two-layer water channel structure inside the second water channel 210 includes two layers, which are a buffer region formed by the second water channel cover 250 and the second intermediate plate 240, and a fin formation region formed by the second fin cover 220, the second intermediate plate 240, and the second fin 230.

The second intermediate plate 240 is joined to the second water channel cover 250. This joining is performed by brazing or laser welding similarly to the first water channel 110. The second fin 230 may be formed on the second fin cover 220 by forging or machining so as to be integrated with the second fin cover 220.

The second intermediate plate second opening 242 serves as a flow path pit that connects the regions (flow paths) of the two layers. A specific connection method using the flow path pit is similar to the method for connecting the buffer region to the fin formation region in the first water channel 110.

Figure 8:
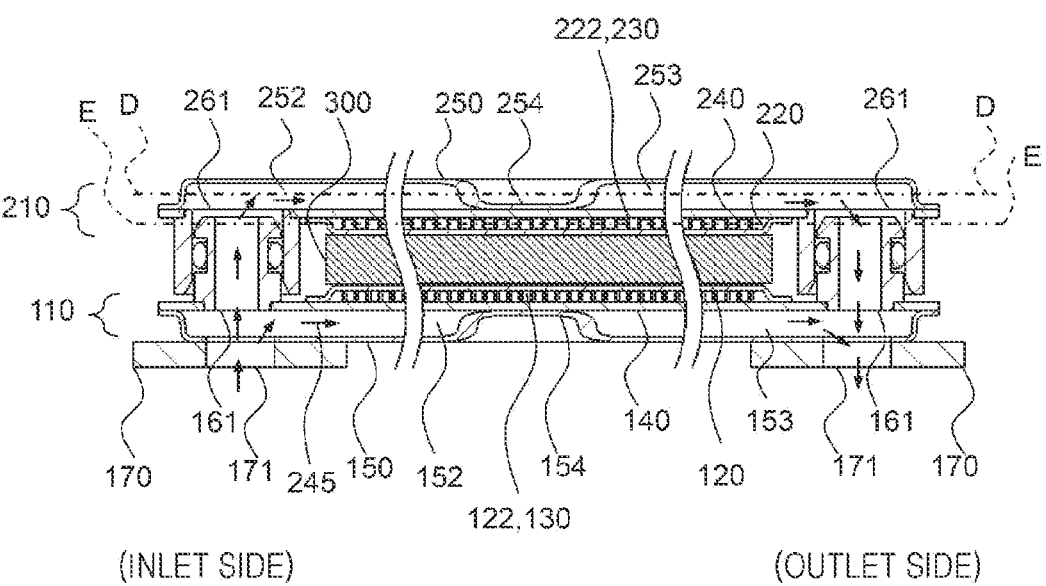
FIG. 8 is a cross-sectional view taken along line B-B in FIG. 4.
Figure 10:
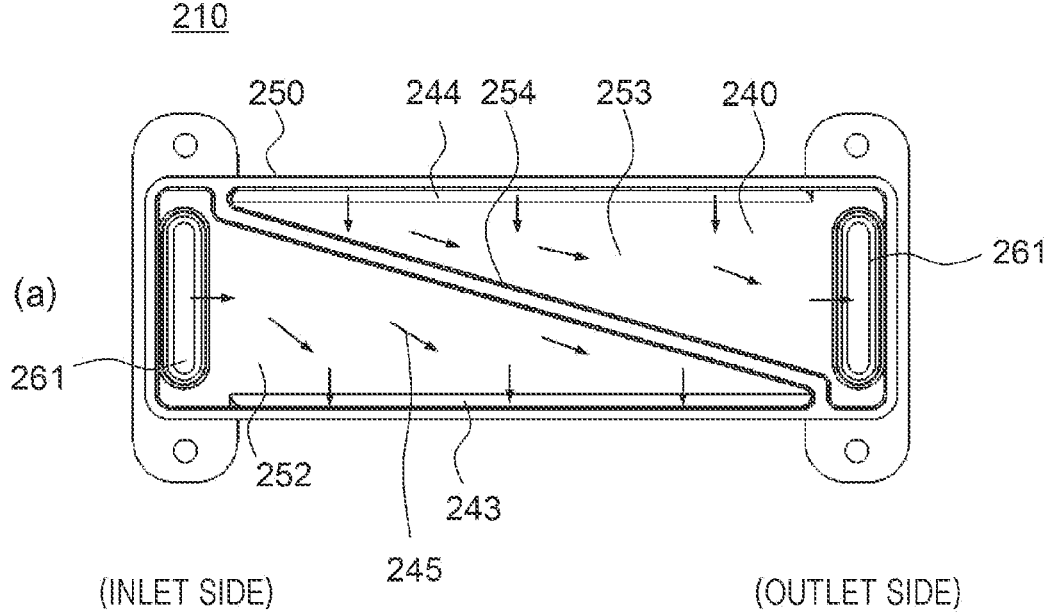
FIG. 10 is a cross-sectional view taken along line D-D in FIG. 8.
Figure 10:
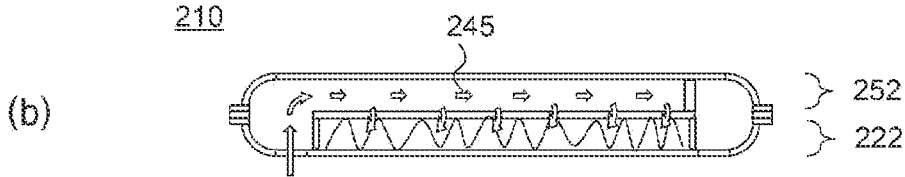

FIG. 8 is a cross-sectional view taken along line B-B in FIG. 4. Note that the cross section D-D in FIG. 8 is used in FIG. 10(a), and the cross section E-E is used in FIG. 11.

The second fin cover 220 has, in close contact with the molded body 300, a second fin cover heat dissipation surface (not illustrated) that cools the molded body 300. The second fin 230 is joined to the second fin cover 220 on a surface opposite to the second fin cover heat dissipation surface. The second fin 230 cools the molded body 300 via the second fin cover 220. The second fin 230 is joined to the second intermediate plate 240 on the upper side of FIG. 8.

The first water channel 110 has a first fin region 122 surrounded by the first fin cover 120 and the first intermediate plate 140. The first fin 130 is disposed in the first fin region 122. The first water channel 110 has a first buffer region 152 and a second buffer region 153 surrounded by the first intermediate plate 140 and the first water channel cover 150.

The first buffer region 152 is disposed so as to form a water channel with either one of two first pipe openings 161. The second buffer region 153 is disposed so as to form a water channel with the other one of the two first pipe openings 161. The first water channel cover 150 has a first partition 154. The first partition 154 is disposed so as not to establish a water channel connection between the first buffer region 152 and the second buffer region 153, and changes the direction in which the cooling water flows from the longitudinal direction to the transverse direction.

The first buffer region 152 forms a water channel with the second buffer region 153 via the first fin region 122 (details will be described with reference to FIG. 9). The first buffer region 152 is substantially flush with the second buffer region 153. The first buffer region 152 is located in a position facing the first fin region 122, the first intermediate plate 140 being interposed therebetween. The second buffer region 152 is located in a position facing the first fin region 122, the first intermediate plate 140 being interposed therebetween.

Note that, although the first water channel cover 150 has a configuration in which the first buffer region 152 and the second buffer region 153 are integrated, the configuration may be such that said regions are separate from each other and formed by two components in order to form individual regions.

The second water channel 210 has a second fin region 222 surrounded by the second fin cover 220 and the second intermediate plate 240. The second fin 230 is disposed in the second fin region 222. The second water channel 210 has a third buffer region 252 and a fourth buffer region 253 surrounded by the second intermediate plate 240 and the second water channel cover 250. The third buffer region 252 is disposed so as to form a water channel with either one of two second pipe openings 261. The fourth buffer region 253 is disposed so as to form a water channel with the other of the two second pipe openings 261.

The second water channel cover 250 has a second partition 254. The second partition 254 is disposed so as not to directly form a water channel between the third buffer region 252 and the fourth buffer region 253. The third buffer region 252 forms a water channel with the fourth buffer region 253 via the second fin region 222 (details are described in FIG. 9).

The third buffer region 252 is substantially flush with the fourth buffer region 253. The third buffer region 252 is located in a position facing the second fin region 222, the second intermediate plate 240 being interposed therebetween. The fourth buffer region 253 is located in a position facing the second fin region 222, the second intermediate plate 240 being interposed therebetween.

Note that, although the second water channel cover 250 has a configuration in which the second buffer region 153 and the fourth buffer region 253 are integrated, the configuration may be such that said regions are separate from each other and formed by two components in order to form individual regions.

In addition, either the first buffer region 152 or the second buffer region 153 may be on the water channel inlet side. That is, in a case where the first buffer region 152 is on the inlet side, the second buffer region 153 is on the water channel outlet side. Similarly, either the third buffer region 252 or the fourth buffer region 253 may be on the water channel inlet side. That is, in a case where the third buffer region 252 is on the inlet side, the fourth buffer region 253 is on the water channel outlet side.

The flow of cooling water 245 indicated by arrows in FIG. 8 will be described by taking the first buffer region 152 and the third buffer region 252 as the water channel inlet sides of the first water channel 110 and the second water channel 210, respectively. The cooling water 245 entering the first water channel 110 flows from the water channel opening 171 on the inlet side to the first buffer region 152 via the first water channel cover opening 151 described above. The cooling water 245 entering the second water channel 210 flows to the third buffer region 252 via the first buffer region 152, the first pipe opening 161 on the inlet side, and the second pipe opening 261. The cooling water 245, which flows directly toward the outlet side only by using the first water channel 110, without traveling from the first water channel 110 to the second water channel 210, flows out of the water channel opening 171 on the outlet side through the first water channel cover opening 151 on the outlet side, from the second buffer region 153. Thus, the cooling water is transferred between the buffer region and the fin formation region having the two-layer structure so as to enable functioning as a heat exchange device, thereby reducing the pressure loss.

The cooling water 245 flowing out from the second water channel 210 flows out of the water channel opening 171 on the outlet side through the second pipe opening 261 on the outlet side, the first pipe opening 161 on the outlet side, the second buffer region 153, and the first water channel cover opening 151 on the outlet side, from the fourth buffer region 253.

Note that, although the second water channel cover 250 has a lesser heat dissipation surface effect than the second fin cover 220, when a power conversion device is installed, the former can play a role in assisting heat dissipation of other electronic components by being installed in contact with the other electronic components. Similarly, the first water channel cover 150 can also play a role in assisting heat dissipation of the other electronic components.

Figure 9:
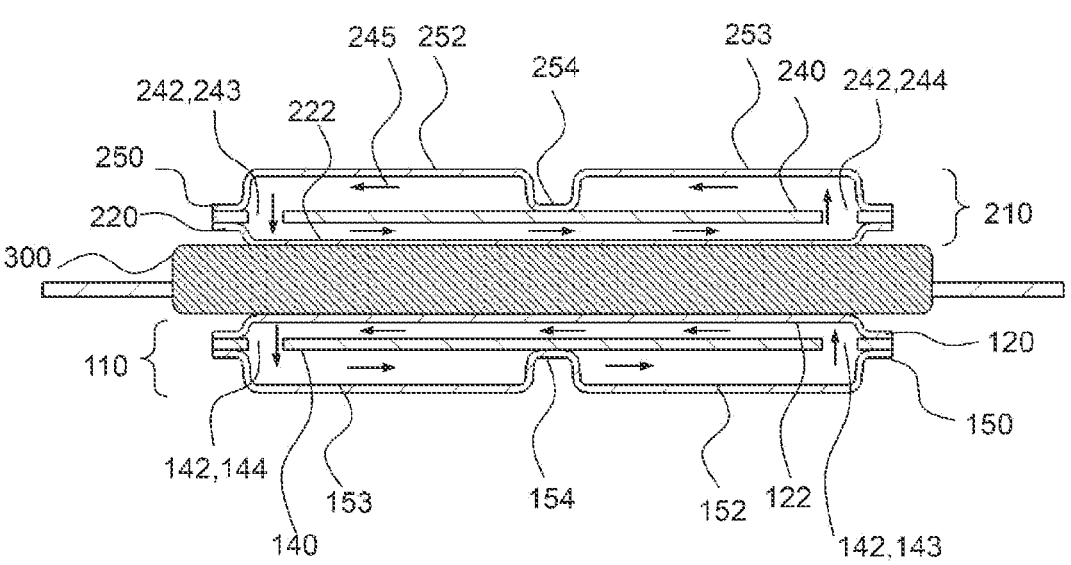
FIG. 9 is a cross-sectional view taken along line C-C in FIG. 4.

FIG. 9 is a cross-sectional view taken along line C-C in FIG. 4.

One of the two first intermediate plate second openings 142 is a first fin region inlet 143. The other of the two first intermediate plate second openings 142 is a first fin region outlet 144. The first fin region inlet 143 connects the first buffer region 152 and the first fin region 122 to form a water channel.

The second fin region outlet 244 forms a water channel connecting the second buffer region 153 and the first fin region 122. The cooling water flow 245 from the first buffer region 152 to the second buffer region 153 flows from the first fin region inlet 143 to the first fin region 122 and the first fin region outlet 144.

One of the two second intermediate plate second openings 242 is a second fin region inlet 243. The other of the two second intermediate plate second openings 242 is a second fin region outlet 244. The second fin region inlet 243 connects the third buffer region 252 and the second fin region 222 to form a water channel.

The second fin region outlet 244 forms a water channel connecting the fourth buffer region 253 and the second fin region 222. The cooling water flow 245 from the third buffer region 252 to the fourth buffer region flows from the second fin region inlet 243 to the second fin region 222 and the second fin region outlet 244.

The direction of the cooling water flow 245 in the first fin region 122 is preferably oriented opposite to the cooling water flow 245 in the second fin region 222. If the direction of the cooling water flow 245 in the first fin region 122 and the direction of the cooling water flow 245 in the second fin region 222 are the same, the first fin region outlet 144 and the second fin region outlet 244 are in positions facing each other with the molded body 300 interposed therebetween, and hence the temperature rise of the cooling water is concentrated and the cooling efficiency decreases.

Therefore, the heat balance of the molded body 300 to be cooled is improved by opposing the direction of the cooling water flow 245. Furthermore, the temperature of the cooling water in the vicinity of the first fin region outlet 144 rises due to the heat generation of the molded body 300, but the second fin region inlet 243 located opposite to the first fin region outlet 144 with the molded body 300 interposed therebetween is in a cooled state, and hence the cooling efficiency of the molded body 300 is improved. Accordingly, it is possible to provide a heat exchange device capable of further improving heat dissipation performance in comparison with the prior art.

FIG. 10(a) is a cross-sectional view taken along line D-D in FIG. 8, and FIG. 10(b) illustrates an aspect in which the cooling water flows to the fin formation region from the buffer region of the second water channel.

On the inlet side of the two second pipe openings 261, the cooling water 245 flows to the third buffer region 252. The direction of flow of the cooling water 245 in the third buffer region 252 changes in orientation from the longitudinal direction to the transverse direction of the second water channel 210, and flows to the second fin region inlet 243. The cooling water flowing from the second fin region inlet 243 passes through the second fin 230 provided on the reverse side (the back side in FIG. 10). The cooling water, which has passed through the second fin 230, flows from the second fin region outlet 244 back to the fourth buffer region 253.

The cooling water flow 245 in the fourth buffer region 253 changes in orientation from the transverse direction to the longitudinal direction and flows to the second pipe opening 261 on the outlet side. By providing the third buffer region 252, the cooling water can flow from the second pipe opening 261 to the second fin region inlet 243 while having a water channel width larger than that in the prior art, and hence the pressure loss can be reduced.

By providing the fourth buffer region 253, the cooling water can flow from the second fin region outlet 244 to the second pipe opening 261 while having a water channel width larger than that in the prior art, and hence the pressure loss can be reduced.

The second water channel partition 254 is arranged in a shape enabling the second water channel 210 to be divided diagonally. The flow path width of the cooling water 245 flowing to the third buffer region 252 decreases from the second pipe opening 261 on the inlet side toward the second fin region inlet 243, and hence the flow rate of the cooling water is reduced. On the other hand, the flow path width of the cooling water 245 flowing to the fourth buffer region 253 increases as the cooling water flows from the second fin region outlet 244 toward the second pipe opening 261 on the outlet side, and hence the flow rate of the cooling water increases.

Thus, the second partition 254 is disposed on a substantially diagonal line of the second water channel 210 having a substantially rectangular shape, and hence the pressure loss can be suppressed and miniaturization is possible. Note that the first water channel 110 also has the same cooling water flow as the second water channel 210.

As shown in FIG. 10(b), the cooling water 245 moves from the third buffer region 252 of the second water channel 210 to the second fin region 222.

Figure 11:
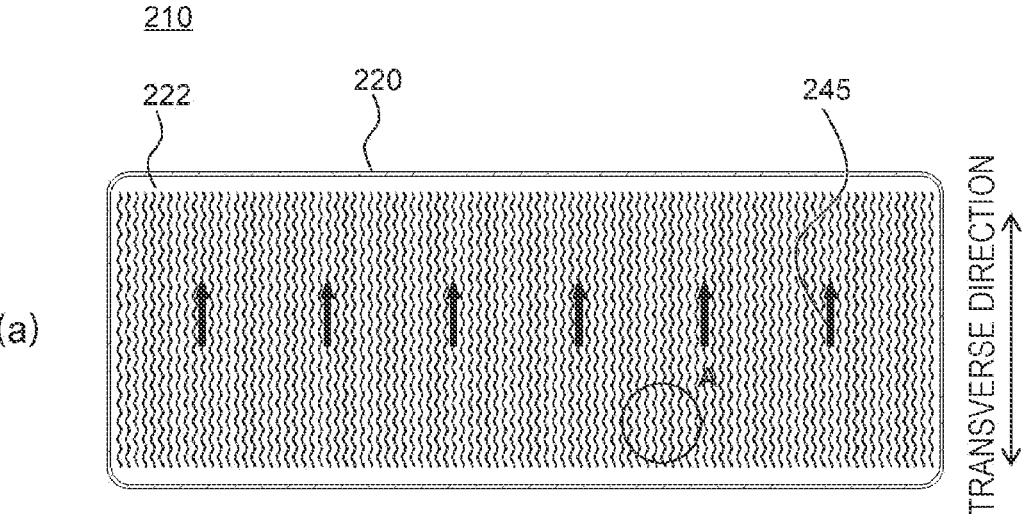
FIG. 11 is a cross-sectional view taken along line E-E in FIG. 8.
Figure 11:
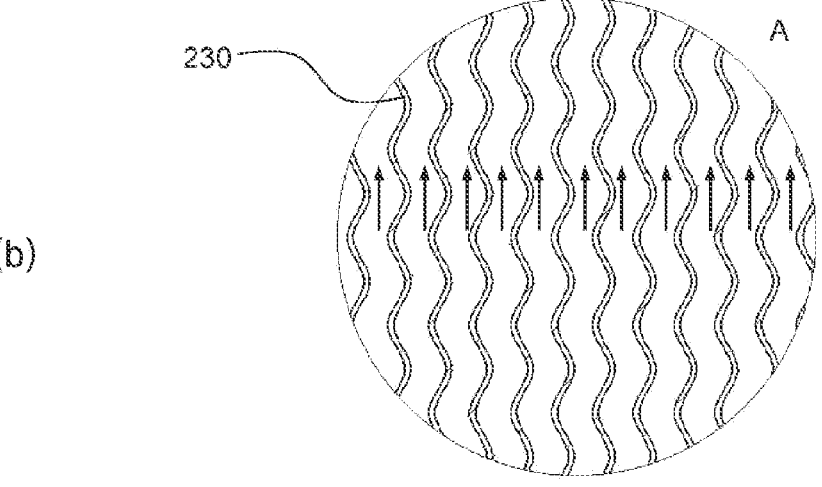
Figure 11:
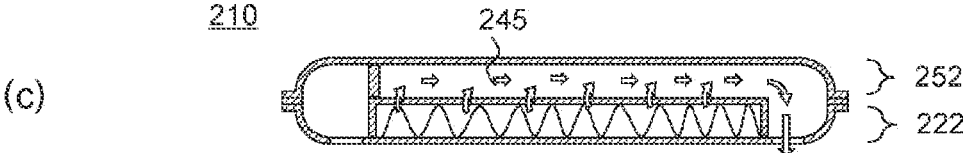

FIG. 11 is a cross-sectional view taken along line E-E in FIG. 8. Note that FIG. 11(b) shows the contents of the enlarged part A shown in FIG. 11(a), and FIG. 11(c) illustrates an aspect in which the cooling water flows to the buffer region from the fin formation region of the second water channel.

The cooling water 245 in the second fin region 222 flows in the transverse direction of the second water channel 210. The second fin 230 is a wave-shaped fin as illustrated in FIG. 11(b), but may be a rectilinear fin, a pin fin, or a square fin. Note that, in terms of form, the same applies to the first water channel 110.

Second Embodiment

Figure 12:
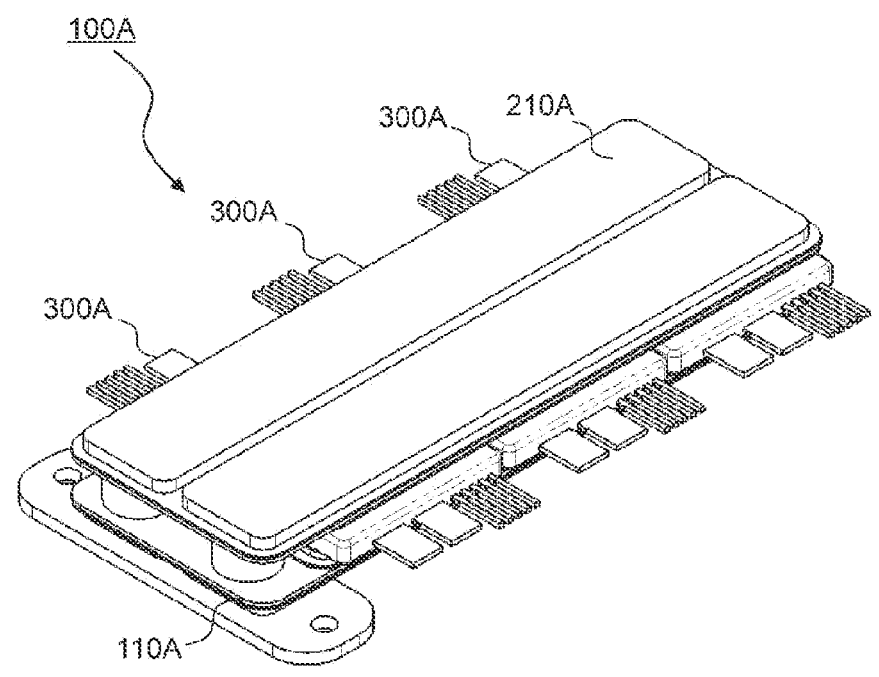
FIG. 12 is an external view of a power module according to a second embodiment.

FIG. 12 is an external view of a power module according to a second embodiment.

A molded body 300A has the same configuration as that of the first embodiment, but the water channel connection between a first water channel 110A and a second water channel 210A is only at one end in the substantially rectangular molded body 300A. Therefore, the configuration is such that the cooling-water inlet and outlet are on the same one end side. A power module 100A has the first water channel 110A, the second water channel 210A, and the molded body 300A. Note that there may be one of or a plurality of the molded body 300A.

Figure 13:
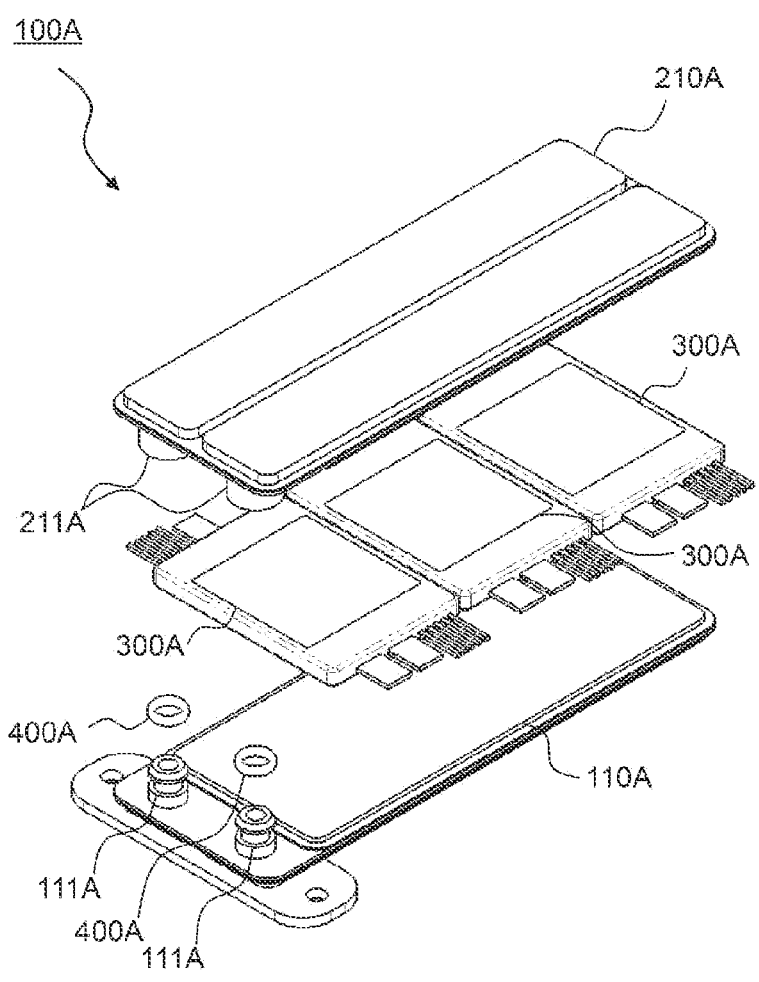
FIG. 13 is an exploded view of FIG. 12.

FIG. 13 is an exploded view of FIG. 12.

One of the first water channel connectors 111A serves as an inlet for the cooling water while the other serves as an outlet for the cooling water. In the case of this Modification, the first water channel connector 111A is provided only on one side of both ends of the power module 100A having a substantially rectangular shape. Therefore, fixability is not improved due to the molded body 300A being sandwiched between the first water channel 110A and the second water channel 210A. Therefore, when the molded body 300A is housed in the case of a power conversion device or the like, it is possible to maintain fixability and improve cooling performance by installing the molded body by sandwiching same between another component and a substrate.

Figure 14:
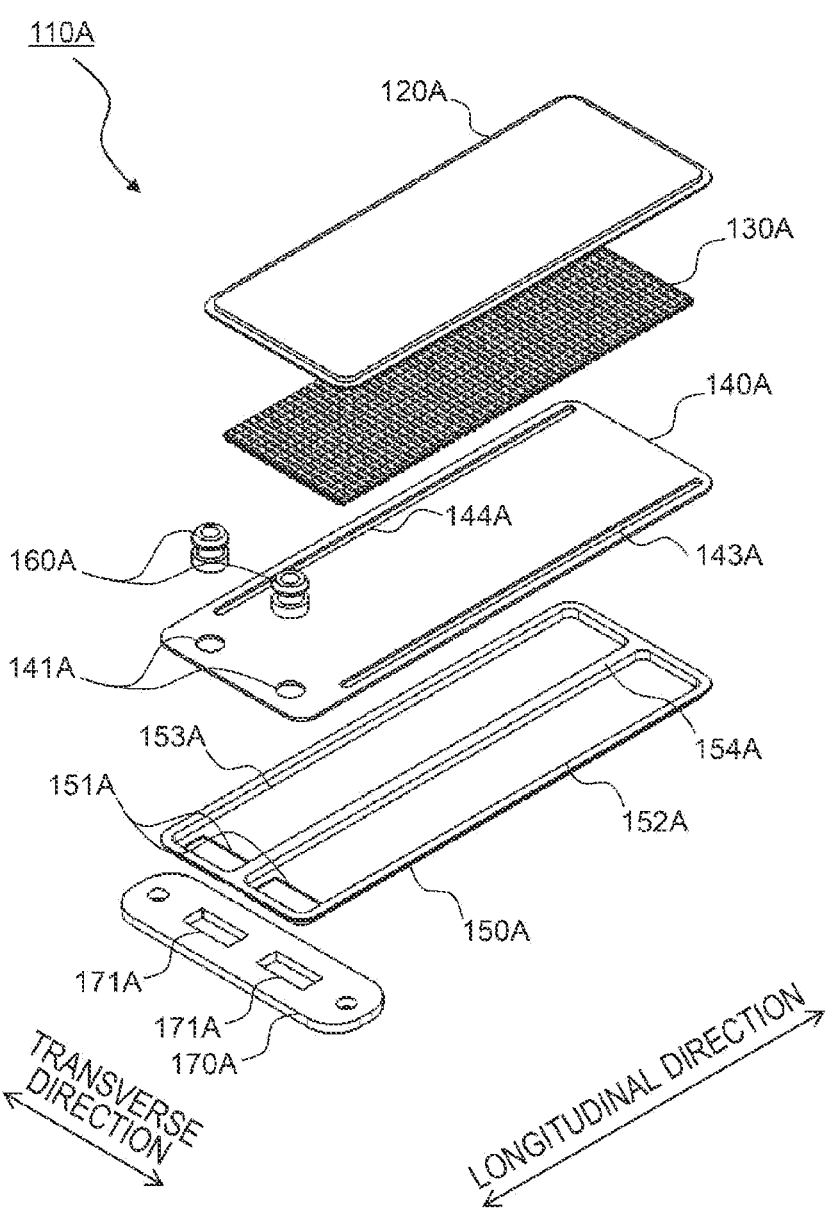
FIG. 14 is an exploded view of a first water channel in FIG. 13.

FIG. 14 is an exploded view of the first water channel in FIG. 13.

The difference from the first embodiment is that a first buffer region 152A and a second buffer region 153A included in a substantially rectangular first water channel cover 150A are partitioned by a first partition 154A parallel to the longitudinal direction.

Figure 15:
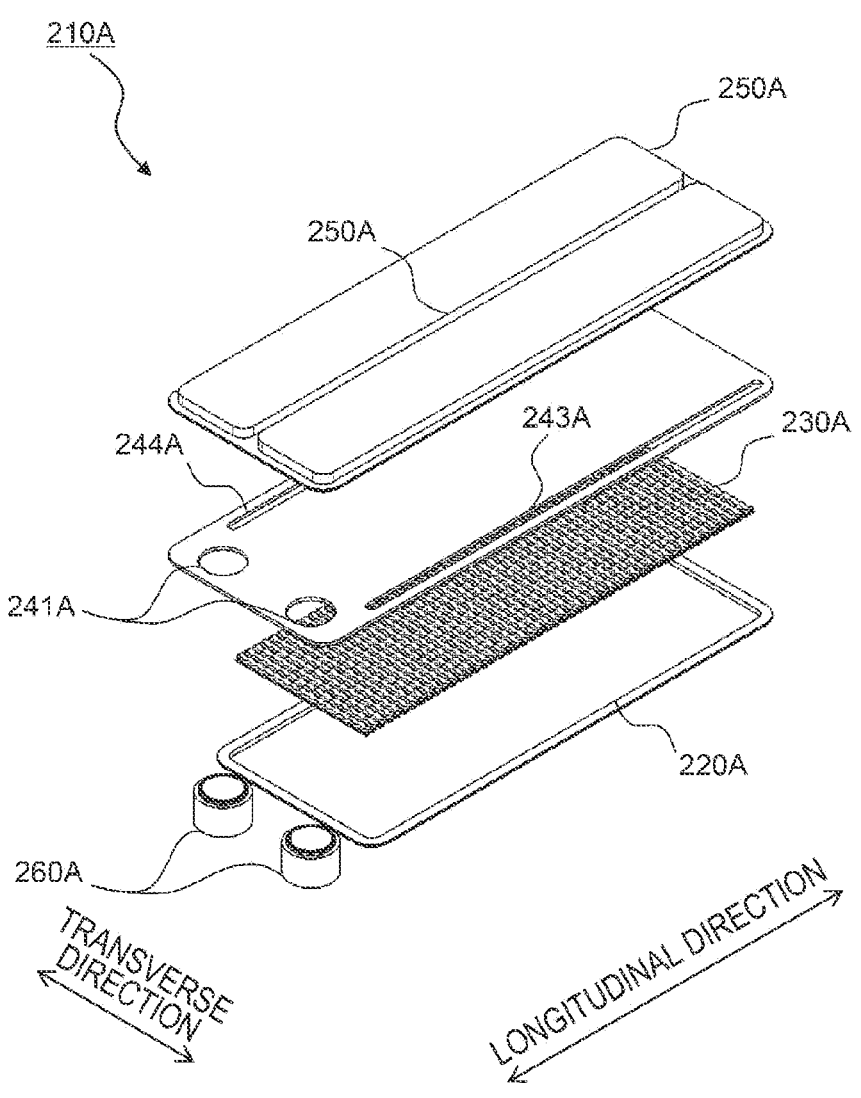
FIG. 15 is an exploded view of a second water channel in FIG. 13.

FIG. 15 is an exploded view of the second water channel in FIG. 14.

The difference from the first embodiment is that a substantially rectangular second water channel cover 250A included in a second water channel 210A is partitioned by a second partition 254A parallel to the longitudinal direction.

Third Embodiment

Figure 16:
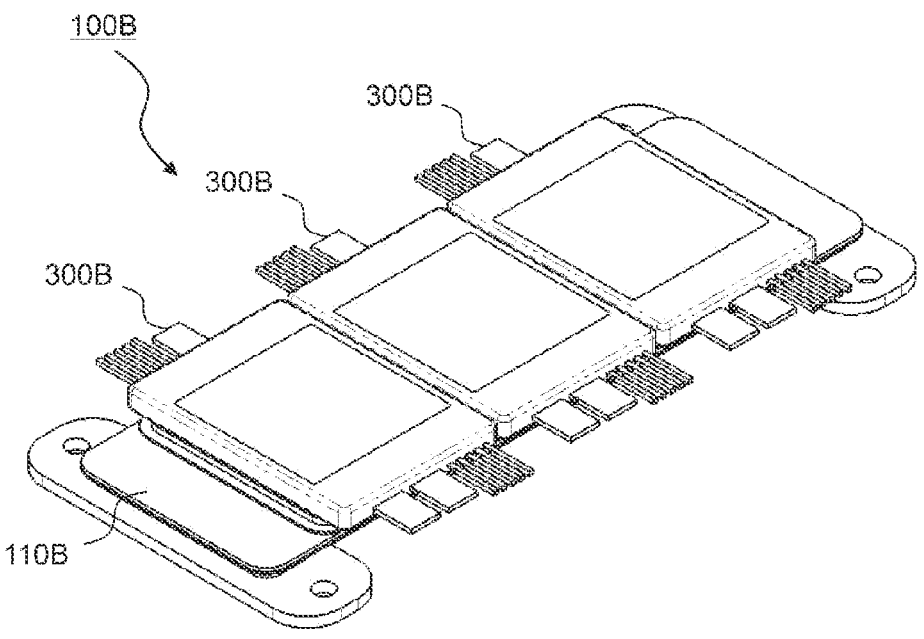
FIG. 16 is an external view of a power module according to a third embodiment.

FIG. 16 is an external view of a power module according to a third embodiment.

A power module 100B includes a molded body 300B and a first water channel 110B. There may be one or a plurality of the molded body 300B. The molded body 300B has the same configuration as the molded body 300 according to the first embodiment. The first water channel 110B cools only one surface of the molded body 300B. The first water channel 110B has the same configuration as the first water channel 110 according to the first embodiment except for not having a water channel portion connected to the second water channel. Accordingly, the entire power module 100B can be miniaturized.

According to the first to third embodiments of the present invention described above, the following actions and effects are achieved.

(1) The heat exchange device is a heat exchange device formed in a substantially rectangular shape, the heat exchange device comprising: a fin formation region in which cooling water flows in a transverse direction of the heat exchange device; and a buffer region formed in a lamination direction and facing the fin formation region, a partition wall being interposed therebetween, an inlet and an outlet for the cooling water are respectively formed at at least one of both ends in a longitudinal direction of the heat exchange device, a flow path pit connecting the fin formation region and the buffer region is formed in the longitudinal direction at both ends in the transverse direction, and the buffer region has a partition that divides the cooling water flowing in from the inlet and the cooling water flowing toward the outlet, and the inlet and the outlet are respectively connected to the fin formation region via the flow path pit. With this configuration, it is possible to provide a heat exchange device in which pressure loss is reduced and heat dissipation performance is improved.

(2) The partition is disposed diagonally in the heat exchange device. With this configuration, it is possible to reduce the pressure loss due to the cooling water flowing in the buffer region.

(3) A power semiconductor element is sandwiched between the two heat exchange devices and is in contact with the fin formation region via covers of the heat exchange devices. With this configuration, heat dissipation of the module body is promoted.

(4) The buffer region reduces the flow path width as the cooling water flows from the inlet toward the flow path pit, and increases the flow path width as the cooling water flows from the flow path pit toward the outlet. With this configuration, it is possible to reduce pressure loss with respect to the water channel.

(5) The two fin formation regions facing each other with the power semiconductor element interposed therebetween cause cooling water to flow in mutually opposite directions. With this configuration, heat is dissipated with a favorable heat balance, and a decrease in performance of the module body can be suppressed.

(6) In a heat exchange device formed in a substantially rectangular shape, an inlet and an outlet formed at both ends in a longitudinal direction of the heat exchange device are formed only at one of both ends in the longitudinal direction. With this configuration, it is possible to reduce the number of water channel connectors and contribute toward creating space at the time of storage.

(7) One surface of the power semiconductor element is cooled by the heat exchange device. With this configuration, it is possible to realize a structure for the surface not in contact with the water channel with which heat is dissipated via a component other than a water channel.

(8) By realizing a power conversion device which includes a heat exchange device having features (1) to (7) above, it is possible to provide a highly reliable power conversion device.

Note that a plurality of the heat exchange device described above may be incorporated in the power conversion device, or only one heat exchange device may be incorporated therein.

In addition, the cooling water flowing through the fin formation region and the buffer region flows in from the buffer region, flows into the fin formation region, and returns to the buffer region again. Alternatively, the cooling water may enter from the fin region, flow to the buffer region, and then return to the fin region again.

In addition, although the present invention is described with a configuration in which the entrance and exit to and from the water channel are only from the buffer region, the entrance and exit of the water channel connected to the fin region may be provided so that the cooling water can enter and exit from both layers.

Moreover, deletion, replacement with another configuration, and addition of another configuration can be performed without departing from the technical concepts of the invention, and aspects thereof are also incorporated within the scope of the present invention.

REFERENCE SIGNS LIST

100, 100A, 100B power module
110, 110A, 110B first water channel
111A first water channel connector
120, 120A first fin cover
121 first fin cover heat dissipation surface
122 first fin region
130, 130A first fin
140, 140A first intermediate plate
141, 141A first intermediate plate first opening
142 first intermediate plate second opening
143 first fin region inlet
144 first fin region outlet
150, 150A first water channel cover
151, 151A first water channel cover opening
152 first buffer region
153 second buffer region
154 first partition
160, 160A first pipe
161 first pipe opening
162 sealing material accommodation portion
170, 170A water channel connection flange
171 water channel opening
172 water channel attachment pit
173 water channel attachment surface
210, 210A second water channel
211, 211A second water channel connector
220, 220A second fin cover
222 second fin region
230, 230A second fin
240, 240A second intermediate plate
241, 241A second intermediate plate first opening
242 second intermediate plate second opening
243 second fin region inlet
244 second fin region outlet
245 cooling water (flow)
250, 250A second water channel cover
251 second water channel cover opening
252 third buffer region
253 fourth buffer region
254, 254A second partition
260, 260A second pipe
261 second pipe opening
300, 300A, 300B molded body
300U upper arm
300L lower arm
311 DC positive terminal
312 DC negative terminal
313 AC terminal
314, 315 signal terminal
330 sealing resin
350 heat conduction member
400 sealing material

The invention claimed is:

1. A heat exchange device formed in a substantially rectangular shape, the heat exchange device comprising:
   a fin formation region in which cooling water flows in a transverse direction of the heat exchange device; and
   a buffer region formed in a lamination direction and facing the fin formation region, a partition wall being interposed therebetween,

13 wherein an inlet and an outlet for the cooling water are respectively formed at at least one of both ends in a longitudinal direction of the heat exchange device, a flow path pit connecting the fin formation region and the buffer region is formed in the longitudinal direction at both ends in the transverse direction, and the buffer region has a partition that divides the cooling water flowing in from the inlet and the cooling water flowing toward the outlet, and the inlet and the outlet are respectively connected to the fin formation region via the flow path pit.

2. The heat exchange device according to claim 1, wherein the partition is disposed on a diagonal line of the heat exchange device.

3. The heat exchange device according to claim 1, wherein a power semiconductor element is sandwiched between two of the heat exchange devices and is in contact with the fin formation region via covers of the heat exchange devices.

4. The heat exchange device according to claim 2, wherein the buffer region reduces a flow path width as the cooling water flows from the inlet toward the flow path pit, and increases the flow path width as the cooling water flows from the flow path pit toward the outlet.

5. The heat exchange device according to claim 3, wherein two of the fin formation regions, which face each other with the power semiconductor element interposed therebetween, cause cooling water to flow in mutually opposite directions.

6. The heat exchange device according to claim 1, wherein the inlet and the outlet are formed at only one of both ends in the longitudinal direction.

7. The heat exchange device according to claim 1, wherein one surface of the power semiconductor element is cooled by the heat exchange device.

8. A power conversion device comprising:
a power semiconductor element; and
a heat exchange device that is formed in a substantially rectangular shape and that cools the power semiconductor element,
the heat exchange device including:

14 a fin formation region in which cooling water flows in a transverse direction of the heat exchange device; and a buffer region formed in a lamination direction and facing the fin formation region, a partition wall being interposed therebetween, wherein an inlet and an outlet for the cooling water are respectively formed at at least one of both ends in a longitudinal direction of the heat exchange device, a flow path pit connecting the fin formation region and the buffer region is formed in the longitudinal direction at both ends in the transverse direction, and the buffer region has a partition that divides the cooling water flowing in from the inlet and the cooling water flowing toward the outlet, and the inlet and the outlet are respectively connected to the fin formation region via the flow path pit.

9. The heat exchange device according to claim 8, wherein the partition is disposed on a diagonal line of the heat exchange device.

10. The power conversion device according to claim 8, wherein a power semiconductor element is sandwiched between two of the heat exchange devices and is in contact with the fin formation region via covers of the heat exchange devices.

11. The power conversion device according to claim 9, wherein the buffer region reduces a flow path width as the cooling water flows from the inlet toward the flow path pit, and increases the flow path width as the cooling water flows from the flow path pit toward the outlet.

12. The power conversion device according to claim 10, wherein two of the fin formation regions, which face each other with the power semiconductor element interposed therebetween, cause cooling water to flow in mutually opposite directions.

13. The power conversion device according to claim 8, wherein the inlet and the outlet are formed at only one of both ends in the longitudinal direction.

14. The power conversion device according to claim 8, wherein one surface of the power semiconductor element is cooled by the heat exchange device.

* * * * *